United States Patent
Nieh et al.

(10) Patent No.: US 12,265,427 B1
(45) Date of Patent: Apr. 1, 2025

(54) SYSTEMS AND METHODS OF CIRCUIT BOARDS FOR WIRELESS INTERFACES OF WEARABLE DEVICES

(71) Applicant: Meta Platforms Technologies, LLC, Menlo Park, CA (US)

(72) Inventors: Chien-Ming Nieh, Palo Alto, CA (US); Deepak Pai Hosadurga, Newark, CA (US); Yue Zheng, San Jose, CA (US); Jaiyoung Park, Sunnyvale, CA (US)

(73) Assignee: Meta Platforms Technologies, LLC

( * ) Notice: Subject to any disclaimer, the term of this patent is extended or adjusted under 35 U.S.C. 154(b) by 302 days.

(21) Appl. No.: 18/085,287

(22) Filed: Dec. 20, 2022

(51) Int. Cl.
*G06F 1/16* (2006.01)
*H05K 9/00* (2006.01)

(52) U.S. Cl.
CPC ............ *G06F 1/1656* (2013.01); *G06F 1/163* (2013.01); *G06F 1/1698* (2013.01); *H05K 9/0032* (2013.01)

(58) Field of Classification Search
CPC ............................. G06F 1/163; H05K 9/0032
See application file for complete search history.

(56) References Cited

U.S. PATENT DOCUMENTS

| | | | |
|---|---|---|---|
| 2017/0135199 A1* | 5/2017 | Moseri | H05K 9/0032 |
| 2021/0376534 A1* | 12/2021 | Kasar | H01R 13/65914 |
| 2022/0330463 A1* | 10/2022 | Kim | G01R 15/04 |

* cited by examiner

*Primary Examiner* — Kevin M Nguyen
(74) *Attorney, Agent, or Firm* — FOLEY & LARDNER LLP

(57) ABSTRACT

A device includes a body having an outer surface. The device includes a plurality of pins in the body, a first pin of the plurality of pins configured to receive a first signal having a first rate, a second pin of the plurality of pins configured to receive a second signal having a second rate less than the first rate. The device includes a shield on a first portion of the outer surface to define an exposed second portion of the outer surface, wherein the second pin is positioned closer to the exposed second portion than the first pin.

20 Claims, 6 Drawing Sheets

SYSTEMS AND METHODS OF CIRCUIT BOARDS FOR WIRELESS INTERFACES OF WEARABLE DEVICES

FIELD OF DISCLOSURE

The present disclosure is generally related to circuit boards for wireless interfaces of wearable devices, including but not limited to shielding for connectors.

BACKGROUND

Developments in computing devices and communication devices have prompted growth in wearable technology. Wearable devices may integrate various components in a compact form, such that the wearable devices can be portable yet perform complex processes. For example, a wearable device may be a smart watch that may access content over the network, and may control or communicate with other computing devices, etc. Such wearable device may be a wrist-based device, a head wearable device, or the like.

SUMMARY

Disclosed herein are implementations related to shielding pins carrying varying signals within a connector. Connectors can carry a plurality of signals via various pins configured for each signal. Examples of these connectors include connectors for receiving and transmitting various types of data, including but not limited to audio, image/video, and network communication data. Carrying high-speed signals can generate noise which can interfere with other signals being transmitted. Some connectors use shields to mitigate noise and interference issues, but the shields can limit the space available for various communication routing paths on or through the connector, which can necessitate larger form factors for the connectors. Connectors in accordance with the present disclosure can have zone-based shielding to reduce total shielding footprint (while maximizing shielding effectiveness) while preserving signal integrity and providing greater space for particular routing paths, allowing for smaller form factors. Ends of shielding segments can be connected together by traces or grounding pads to ensure a complete shielding loop around pins that may carry signals expected to induce noise (e.g., high speed/frequency signals). Furthermore, the pins can be arranged relative to the shields and to each other to allow for a spatial buffer between paths along which signals are passed. By incorporating various such components and arrangements thereof, the amount of shielding and overall size of a connector can be decreased.

Various implementations disclosed herein are related to a device including a body having an outer surface. The device can include a plurality of pins in the body, a first pin of the plurality of pins configured to receive a first signal having a first frequency, a second pin of the plurality of pins configured to receive a second signal having a second frequency less than the first frequency. The device can include a shield on a first portion of the outer surface to define an exposed second portion of the outer surface, wherein the second pin can be positioned closer to the exposed second portion than the first pin.

In some implementations, the device can include the shield including a first shield segment, and a second shield segment on an opposite side of the body from the first shield segment. In some implementations, the shield can include a third shield segment connecting a first end of the first shield segment with a first end of the second shield segment. The device can include a trace connecting a second end of the first shield segment with a second end of the second shield segment.

In some implementations, the first pin can be in a zone defined by respective edges of the first shield segment and the second shield segment, and the second pin can be outside the zone and coupled with a routing trace on the exposed second portion of the outer surface.

In some implementations, the device can include a ground pad to isolate the first pin located on a first side of the ground pad from the second pin located on a second side of the ground pad. In some implementations, the first signal has a noise component having a frequency of at least 100 MHz, and the shield is positioned relative to the first pin to reduce the noise component by at least a threshold amount, such as to cause a threshold attenuation of the noise component.

In some implementations, the shield can be a first shield. The device can include a second shield on a third portion of the outer surface to define the second portion between the first portion and the third portion. The first shield and the second shield can cause a threshold attenuation of noise arising from a signal passing through the first pin.

Various implementations disclosed herein are related to a circuit. The circuit can include a circuit board. The circuit can include a connector. The connector can include a body having an outer surface. The connector can include a plurality of pins in the body. A first pin of the plurality of pins can be configured to receive a first signal having a first frequency. A second pin of the plurality of pins can be configured to receive a second signal having a second frequency less than the first frequency. The connector can include a shield on a first portion of the outer surface to define an exposed second portion of the outer surface, wherein the second pin can be positioned closer to the exposed second portion than the first pin.

In some implementations, the shield can include a first shield segment and a second shield segment on an opposite side of the body from the first shield segment. In some implementations, the shield can include a third shield segment connecting a first end of the first shield segment with a first end of the second shield segment. The shield can include a trace connecting a second end of the first shield segment with a second end of the second shield segment.

In some implementations, the first pin is in a zone defined by respective edges of the first shield segment and the second shield segment, and the second pin is outside the zone and coupled with a routing trace on the exposed second portion of the outer surface.

In some implementations, the circuit can include a ground pad extending through the body to isolate the first pin located on a first side of the ground pad from the second pin located on a second side of the ground pad. In some implementations, the shield is positioned relative to the first pin to cause a threshold attenuation of noise arising from a signal having a frequency of at least 10 MHz passing through the first pin.

In some implementations, the shield can be a first shield. The device can include a second shield on a third portion of the outer surface. The second shield can define the exposed second portion between the first portion and the third portion. The first shield and the second shield can cause a threshold attenuation of noise arising from a signal passing through the first pin.

Various implementations disclosed herein are related to a wearable device. The wearable device can include a data transmission circuit. The wearable device can include a circuit board. The wearable device can include a connector connecting the communication circuit with the circuit board. The connector can include a body having an outer surface. The connector can include a plurality of pins in the body, one or more pins of the plurality of pins coupled with the circuit board. A first pin of the plurality of pins can be configured to receive a first signal having a first frequency. A second pin of the plurality of pins can be configured to receive a second signal having a second frequency less than the first frequency. A shield on a first portion of the outer surface can define an exposed second portion of the outer surface, wherein the second pin can be positioned closer to the exposed second portion than the first pin.

In some implementations, the shield includes a third shield segment connecting a first end of the first shield segment with a first end of the second shield segment. The first pun can be in a zone defined by the first shield segment, the second shield segment, and the third shield segment. The second communication pin can be outside the zone and can be coupled with a routing trace on the exposed second portion of the outer surface.

In some implementations, the wearable device can include a ground pad to isolate the first pin on a first side of the ground pad from the second pin located on a second side of the ground pad. In some implementations, the shield is positioned to cause a threshold attenuation of noise arising from a signal having a frequency of at least 100 MHz passing through the first pin.

In some implementations, the shield can be a first shield. The wearable device can include a second shield on a third portion of the outer surface to define the exposed second portion between the first portion and the third portion. The first shield and the second shield can be configured to cause a threshold attenuation of noise arising from a signal passing through the first pin.

BRIEF DESCRIPTION OF THE DRAWINGS

The accompanying drawings are not intended to be drawn to scale. Like reference numbers and designations in the various drawings indicate like elements. For purposes of clarity, not every component can be labeled in every drawing.

DETAILED DESCRIPTION

Figure 1:
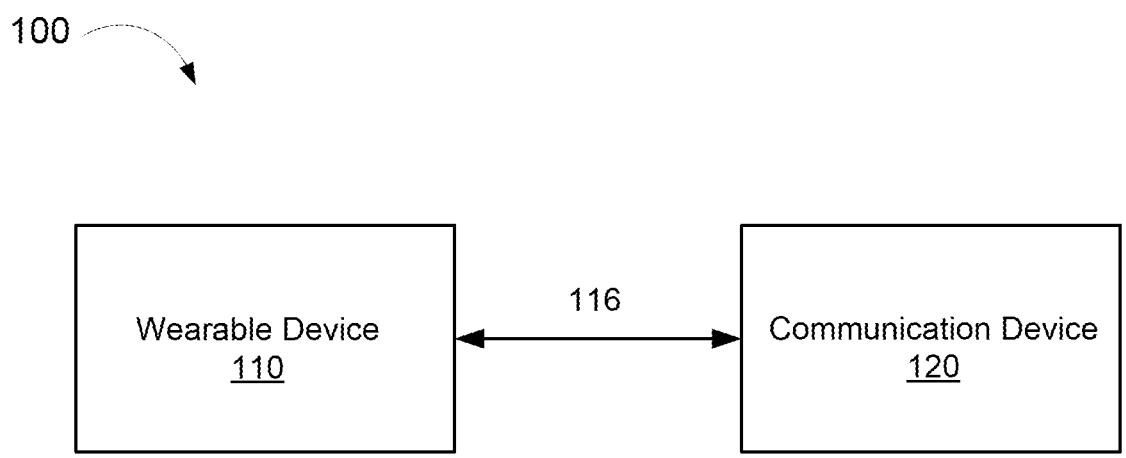
FIG. 1 is a block diagram showing a system environment including a wearable device, according to an example implementation of the present disclosure.

Before turning to the figures, which illustrate certain implementations in detail, it should be understood that the present disclosure is not limited to the details or methodology set forth in the description or illustrated in the figures. It should also be understood that the terminology used herein is for the purpose of description only and should not be regarded as limiting.

Disclosed herein are implementations related to shielding pins carrying varying signals within a connector. Connectors can carry a plurality of signals via various pins configured for each signal. Examples of such connectors include USB-C or HDMI 1.0. Carrying high-speed signals can generate undesirable noise which can be picked up by the other signals being transmitted outside the connector or through the connector. The noise can radiate out especially through a connector where there is a disconnect continuity. This noise can affect signal quality and make decoding difficult. Current implementations make use of heavily shielded connectors in an attempt to preserve signal integrity. These connectors shield groups of pins and/or individual pins to ensure signal integrity. This amount of shielding results in a large, bulky connector which can be difficult to maneuver or use for small applications.

The present solution enables zone-based shielding to reduce the shielding material around and/or between pins to preserve different signals. Each pin of the connector can be considered to be in a zone. Multiple pins can be in one zone. Each zone can be shielded by sections of shielding, such as if the pins within the zone are expected to be carrying signals that may cause significant or high-frequency noise. Some zones can be unshielded if they are less likely to generate such noise. Unshielded zones may include an exposed portion by which pins can be exposed and connected to, such as by a trace. In this manner, some (e.g., low speed/rate) signals can be run on a surface layer. Ends of shielding segments can be connected together by traces and/or complemented by grounding pads to more completely shield pins carrying signals that may be more likely to generate noise. Furthermore, low-risk signals can be strategically located to provide a buffer between different high-risk signals.

By shielding particular signals and buffering between different zones of signals, the amount of shielding and overall size of a connector can be decreased. This structural approach of using distinct zones for passing signals of different speeds and/or frequencies can decrease the necessity for shielding around all of the pins, thereby enabling a more compact connector. For example, this approach can enable an exposed trace (e.g., for low speed signals) to run on a surface layer of the connector, which can reduce size requirements of the connector.

Although various implementations disclosed herein are provided with respect to wearable devices, principles disclosed herein can be applied to other handheld devices (e.g., smart phones, tablet computers, laptops, etc.).

FIG. 1 is a block diagram of an example system 100. In some implementations, the system 100 includes a communication device 120 and a wearable device 110. The communication device 120 may be an access point or any other communication device, and the wearable device 110 may be a wrist-based wearable (or wrist wearable) device, such as a smart watch. The wearable device 110 and the communication device 120 may communicate with each other through a communication link 116. Through the wireless communication link 116, the wearable devices 110 may access content (e.g., text, image, audio, video, etc.) from other devices. The communication links 114, 116, 118 may be wireless links (e.g., cellular link, Wi-Fi link, Bluetooth link, 60 GHz link, ultra wideband link, etc.). The communication link 116 may conform to the 3G, 4G, 5G, LTE, or 60 GHz protocol, for example. In some implementations, the system 100 includes more, fewer, or different components than those shown in FIG. 1. The system 100 may include additional wearable devices and corresponding communication links providing access between the wearable devices and between each wearable device and the communication device 120. For example, the system 100 may alternatively or additionally include a head wearable device (HWD) coupled to the communication device 120 through another communication link similar to the communication link 116. The HWD may be referred to as, include, or be part of a head mounted display (HMD), head mounted device (HMD), head worn display (HWD) or head worn device (HWD). For purposes of simplicity, the present disclosure is discussed in reference to the wearable device 110 being a wrist wearable device, such as a smart watch, though the present disclosure is not limited hereto.

In an example implementation, the wearable device 110 may operate to provide and/or support artificial reality for a user. In one example, the wearable device 110 may receive a sensor measurement directly or indirectly from the user, and may generate or determine a view of the artificial reality corresponding to a detected location and orientation of the user. The wearable device 110 may generate image data of the determined view of the artificial reality for display and/or transmit the image data to another wearable device for further processing.

Figure 2:
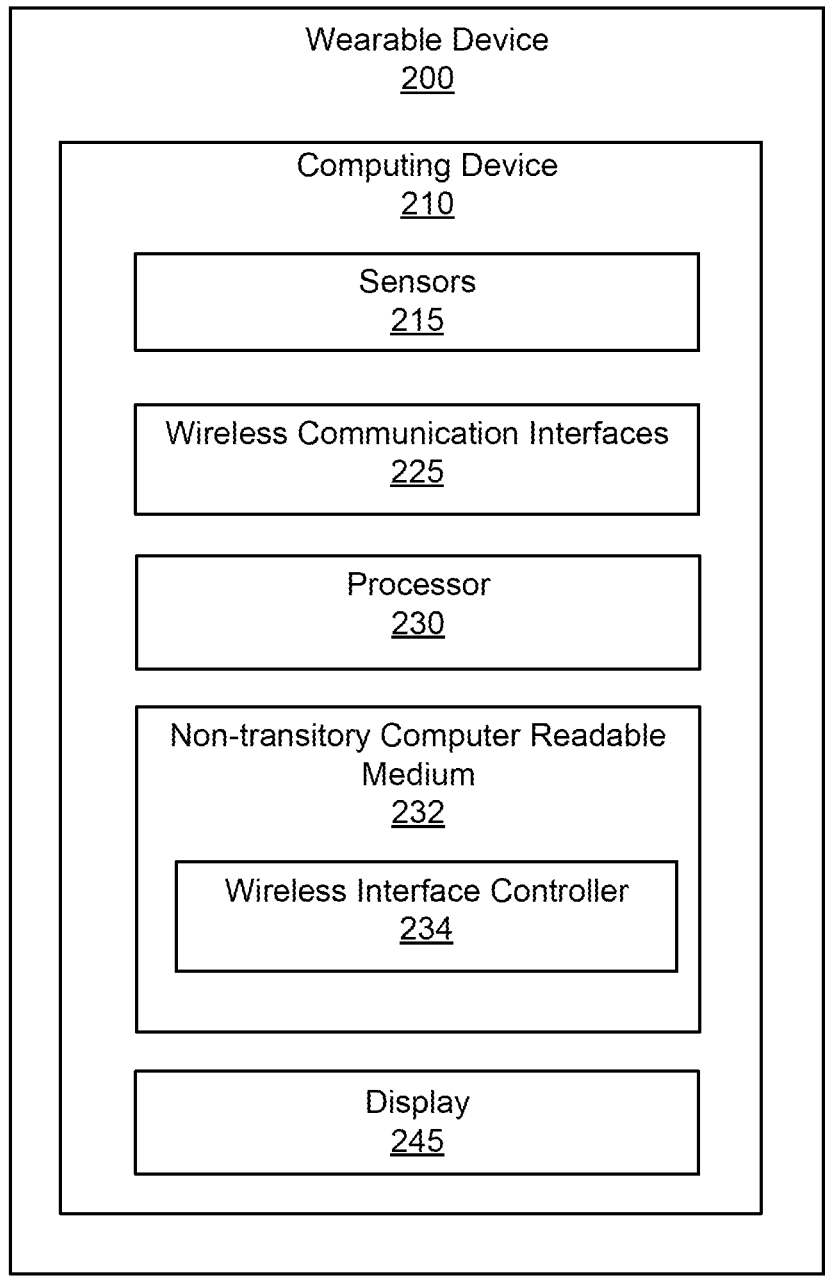
FIG. 2 is a block diagram showing components of a wearable device, according to an example implementation of the present disclosure.

FIG. 2 is a diagram of a wearable device 200, according to an example implementation of the present disclosure. In some implementations, the wearable device 200 may be implemented as the wearable device 110 (e.g., a wrist wearable device or a head wearable device). In some implementations, the wearable device 200 includes a computing device 210 and a cradle (e.g., cradle 250 in FIG. 3A), to which the computing device 210 can be selectively attached (e.g., removable). In some implementations, the computing device 210 includes sensors 215, wireless communication interfaces 225 (also referred to as "wireless interfaces 225" hereafter), a processor 230, a non-transitory computer readable medium 232, and a display 245. These components may operate together to communicate with another device and generate or render content (e.g., artificial reality content). In some implementations, the wearable device 200 includes more, fewer, or different components than those shown in FIG. 2.

In some implementations, the sensors 215 include electronic components or a combination of electronic components and software components that detect a proximity of a user wearing the wearable device 200. For example, the sensors 215 can include a hall sensor (not depicted separately) that can detect whether the user is proximate (e.g., less than 10 mm) to the sensor or whether the user is contacting the computing device 210 (e.g., contacting and/or blocking a certain component of the device used or configured for wireless communication). The sensors 215 may detect a proximity of the user with respect to the computing device 210, and can generate a sensor measurement data indicating the detected proximity.

In some implementations, the sensors 215 include electronic components or a combination of electronic components and software components that can operate to sense/determine/measure a location and/or an orientation of the computing device 210. Examples of the sensors 255 can include one or more imaging sensors, one or more accelerometers, one or more gyroscopes, one or more magnetometers, any other suitable type of sensor(s) that can detects motion and/or location, or combinations thereof. For instance, one or more accelerometers can measure translational movement (e.g., forward or back, up or down, left or right) and one or more gyroscopes can measure rotational movement (e.g., pitch, yaw, or roll). In some implementations, the sensors 215 detect the translational movement and the rotational movement, and determine an orientation and location of the computing device 210. The sensors 215 may generate sensor measurements indicating the detected location and orientation of the computing device 210.

In some implementations, wireless communication interfaces 225 include electronic components or combinations of electronic components and software components that communicate with another device through wireless communication links (e.g., communication link 116). In some implementations, the electronic components of the wireless communication interfaces 225 are provided on a printed circuit board (PCB). In some implementations, one or more antennas are formed on the PCB and configured to transmit and receive data between the wearable device 110 and another device (e.g., the communication device 120 or another wearable device). In some implementations, the wireless communication interfaces 225 include a wireless interface for a cellular communication link (e.g., 3G, 4G, or LTE communication link). The wireless communication interfaces 225 may also include a wireless interface for a different communication link (e.g., Wi-Fi or Bluetooth communication link). In some implementations, wireless communication interfaces 225 include or are embodied as transceivers or communication modems coupled to the transceivers for transmitting and receiving data through wireless mediums. The wireless communication interfaces 225 may transmit or receive sensor measurement data indicating locations and orientations of the computing device 210. Moreover, the wireless communication interface 225 may transmit or receive image data indicating or corresponding to images to be rendered.

In some implementations, the processor 230 includes an electronic component or a combination of electronic components that can execute instructions stored by the non-transitory computer readable medium 232. The processor 230 may include one or more central processing units (CPUs), graphical processing units (GPUs), or combinations thereof. The non-transitory computer readable medium 232 may store instructions for executing one or more applications executable by the processor 230.

One example application when executed by the processor 230 may cause the processor 230 to generate or process content for rendering. The processor 230 executing the application may cause the processor 230 to generate image data for rendering, according to sensor measurement data received from the sensors 215 or the wireless communication interfaces 225. For example, the processor 230 executing the application may determine a view of the artificial reality corresponding to detected location and orientation in the sensor measurement data and generate image data of the determined view of the artificial reality accordingly. Example applications when executed by the processor 230 may cause the processor 230 to control or adjust the wireless communication interfaces 225.

In some implementations, the display 245 is an electronic component that displays an image. The display 245 may, for example, be a liquid crystal display or an organic light emitting diode display. The display 245 may be a touch screen display. The display 245 may be a transparent display that allows the user to see through.

Figure 3:
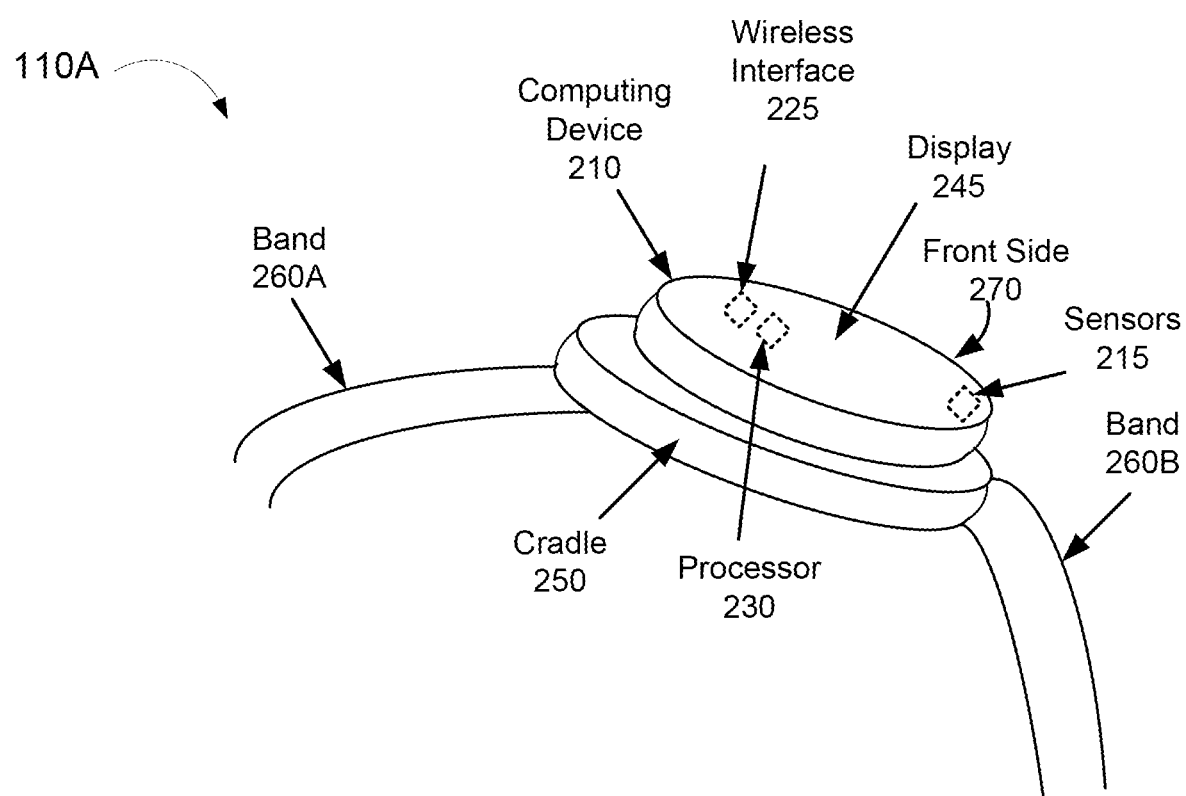
FIG. 3 is a schematic diagram showing a perspective view of a wearable device including a computing device attached to a cradle, according to an example implementation of the present disclosure.

FIG. 3 is a diagram showing a perspective view of an implementation of the wearable device 110A, the wearable device 110 including a computing device 210 attached to a cradle 250, according to an example implementation of the present disclosure. The processor 230, the wireless communication interfaces 225 and the sensors 215 may be disposed within a housing of the computing device 210, such that the processor 230, the wireless communication interfaces 225 and the sensors 215 may not be visible to the user. The computing device 210 may also include the display 245 on a front side 270 to present text or image.

The computing device 210 may be detachable from the cradle 250. The computing device 210 may be detached from the cradle 250 to allow the user to charge the battery of the computing device 210, connect to another device through a cable, or capture an image, etc. The cradle 250 may be a wearable structure or a component to selectively hold, contain, connect, grasp and/or couple the computing device 210. The cradle 250 may include one or more couplers (not depicted), to which a back side or other portion of the computing device 210 can be attached. One or more couplers 450 may include mechanical latches, magnetics, hook and loop fasteners, or any component(s) that allow the cradle 250 to selectively hold or couple the computing device 210. The cradle 250 may include or may be attached to wrist bands 260A, 260B. It is noted other types of wearable devices (e.g., an HWD) may also be applicable to the present disclosure.

Figure 4:
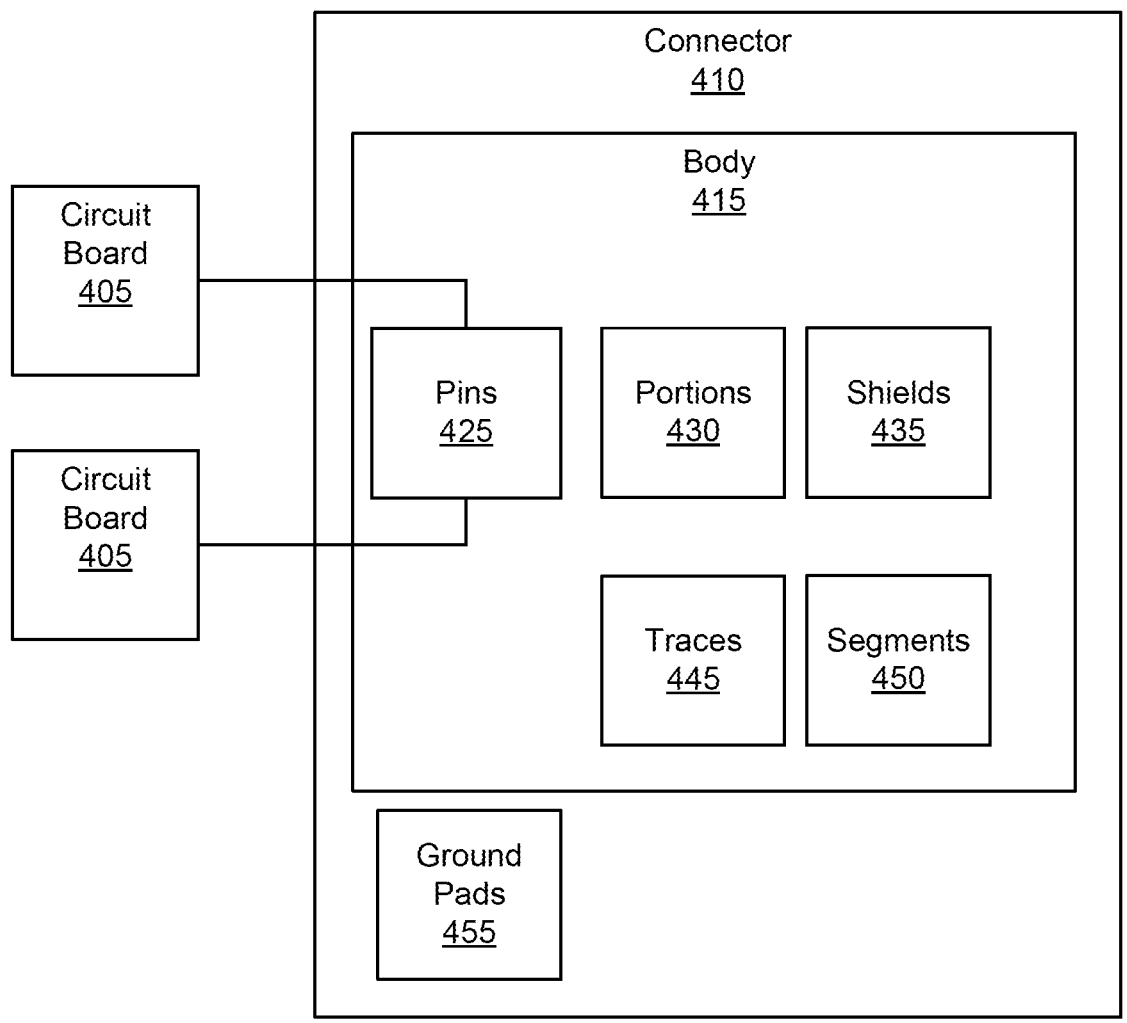
FIG. 4 is a schematic diagram showing a circuit board system, according to an example implementation of the present disclosure.

FIG. 4 is a schematic diagram showing an example of a circuit 400. The circuit 400 can include a plurality of circuit boards 405 and at least one connector 410. The circuit 400 and components thereof, such as the circuit boards 405, can include any type of hardware (such as logic boards, printed circuit boards (PCBs), systems of a chip (SoCs), embedded chips, MOSFETs, or BJTs) to implement the system described herein. The circuit 400 can be a system for transmitting a signal via a connector to a circuit board.

The circuit boards 405 can be any type of circuit board (e.g., single sided PCB, multilayered PCB, strip board, nanoelectronic board) which can be connected to connector 410. The circuit board 405 can include a port to receive inputs. The circuit board 405 can be or be a circuit of at least a communications board, a controller board, a data transmission circuit, or a display device. The plurality of circuit boards 405 connected by the connector 410 can be of the same or different types. For example, a data transmission circuit can be connected to a display device via connector 410. Circuit boards 405 can be included in a device, such as the wearable device 200. The circuit board 405 can include circuitry components such as conductors (e.g., copper, aluminum, nanowires, traces), resistors, sensors, substrates, transistors, grounding points, embedded chips, or antennas.

The connector 410 can be used to pass (e.g., receive and transmit) signals between the circuit boards 405 that can be connected on either side of the connector 410 with the connector 410. As described further herein, the connector 410 can facilitate transmitting signals, including relatively high speed/rate signals, between the circuit boards 405 while reducing or minimizing noise effects that might result from the transmission of the signals. The connector 410 can be any type of connector for passing signals between one or more devices, implements, displays, communication circuits, circuit boards, computers, transmitters, or receivers. For example, the connector 410 can be male, female, include one or a plurality of contacts, pitches, or mounts to connect to outside devices. The connector 410 can be a pin headed connector. For example, the connector 410 can have a plurality of pins which can transmit signals to the one or more devices. The connector 410 can include strain relief components such as plastic overmolding, crimping, or various sleeve designs. The connector 410 can be any diameter or dimensions to accommodate its subcomponents. The connector 410 can include cables for signal transmission, such as ribbon type cables, twisted pair, or fiber optic.

The connector 410 can include a body 415. The body 415 can be a portion of the connector 410 in which components of the connector 410 are provided. The body 415 can surround or encompass a portion of the connector 410. The body can be made of a plurality of materials, including silicon, dielectric substrate/material, silicone, copper, rubber, copper, air, aluminum, or carbon. The body 415 can be bisected (either physically with a barrier or by an indicator or demarcation) or otherwise portioned into different subsections. Various zones of the body 415 can be isolated from other zones, such as by a grounding strip, ground pad(s), insulator, or shield.

The body 415 can have an outer surface. The outer surface can extend around or encompass various components of the connector 410, such as at least one of the shields 435, traces 445, or segments 450. The outer surface 420 can be exposed (e.g., with no shielding material) or covered (e.g., with shielding material).

The outer surface can be subdivided into portions 430. Each portion 430 of the outer surface 420 can include or be positioned around, for example, various combinations of shields 435, traces 445, or pins 425. The portions 430 can include a first portion, a second portion, or a third portion. Each portion can be different in size. The portions 430 can be used to expose portions of the outer surface 420. For example, a first portion of the plurality of portions 420 may include a shielding mesh and a second portion of the plurality of portions 420 may include nothing and be exposed.

The connector 410 can include a plurality of pins 425. The pins 425 can pass various signals 440. Pins 425 can connect to traces 445, segments 450 of shields 435, and ground pads 455. The connector 410 can communicate a plurality of signals 440 through pins 425 to circuit boards 405 with different configurations of portions 430, shields 435, traces 445, and ground pads 455. In certain embodiments, at least one of the pins 425 is or is connected to a ground pad, and can for example provide some shielding between other pins that are signal carrying (e.g., pins located on different sides of the ground pad/pin).

The pins 425 can be a plurality of pins to form connections between the connector 410 and circuit boards 405. Pins 425 can be exposed. Pins 425 can be made of conductor(s) or metal such as brass, nickel, copper, aluminum, or silver. The pins 425 can be coated in a metal different from their core. The pins 425 can be used to perform communication, power, shielding or grounding functions. For example, the pins 425 can carry a plurality of signals 440, including high speed (above 100 MHz), low speed (e.g., under 300 kHz), or ground. The pins 425 can be coupled to circuit board 405, for example by connecting to a port of circuit board 405. The pins 435 can be subdivided into zones. Each pin of the plurality of pins 425 can carry a different signal and can have different shielding. A pin of the plurality of pins 425 can be unshielded. The pins can be arranged within the body 415 in a variety of configurations and can be of varying quantities.

The pins 425 can be used to communicate signals including any type of communication or power signal to be transmitted by the connector 410. For example, the pins 425 can communicate DC power, high speed signals (e.g., above 100 MHz), low speed signals (e.g., under 300 kHz), ground, or pulse-width modulation signals. The signals can vary in rate (e.g., transmission bit rate), amplitude, magnitude, shape, protocol, frequency, period, or duration. The signals can be transmitted to the circuit boards 405 via pins 425. In some implementations, the plurality of signals can induce noise across at least one signal. For example, a first signal travelling on a first pin can induce noise in a second signal travelling on a second pin or a conductor external to the connector, such that it can affect the integrity of the second signal.

The connector 410 can include at least one shield 435. The shields 435 can be located on portions 430 of the outer surface of the body 415. Some portions 430 can be exposed, such as by not having shields 435 on the portions 430. The shields 435 can be any material of the connector 410 intended to reduce, block, stifle, attenuate, or lessen noise (e.g., signal leakage or interference) between signals being communicated inside and/or outside the connector 410. For example, shields can include any conductive, magnetic, resistive, or insulative material surrounding at least a portion 420 of the outer surface 420. Example shielding materials can include metals such as copper, brass, nickel, silver, or steel and can be organized in any pattern such as a mesh, hollow tube, or wires. The shields 435 can cause at least a threshold attenuation (e.g., at least twenty percent, at least fifty percent, at least ninety percent, at least ninety-nine percent, or further attenuation as measured in dB) of noise arising from signals passing through pins 425 as measured at a particular position outside the connector 410 or vice versa with respect to noise from signals communicated outside the connector 410.

The shields 435 can be divided into segments 450. The segments 450 can be made of any of the plurality of aforementioned shielding materials. Each segment 450 of the plurality of segments 450 can be different. Each segment of the plurality of segments 450 can connect together via at least one trace 445 and/or at least one ground pad 455 to form a complete shield. The segments 450 can define portions 430 of the outer surface 420, including so that different portions 430 the outer surface 420 can have different properties.

The connector 410 can include one or more traces 445. The traces 445 can be any conductor on or through a circuit board or layer thereof to bring signal, power, communications, or ground throughout the circuit. The traces 445 can be routed through the circuit board 405, a circuit board of the connector 410, or the body 415 of the connector 410. The traces 445 can be placed on a plurality of layers of and can be connected to pins 425, shields 435, or ground pads 455. The traces 445 can be used to route signals from particular pins 425 that are isolated from other pins 425 by shields 435. As described further herein with reference to FIG. 5, at least one trace 445 can be on the outer surface 420, rather (entirely) extending through the body 415, so that the connector 410 can have a relatively smaller form factor (e.g., can avoid the need for additional layers to provide space for isolating traces through the body 415).

The connector 410 can include one or more ground pads 455. The ground pads 455 can be any type of connection, pin, pad, wire, trace, grid, or rod to which the connector 410 can route a circuit or signal to ground. In some embodiments, the ground pads each has a same/similar structure and/or dimensions as a pin 425, and may be arranged in an array together with pin(s) 450 in the connector. The ground pads 455 can connect with at least a trace 445 or shield 435. Connections to the ground pads 455 can be formed, by example, through soldering, crimping, plug-in, terminal blocks. The ground pad 455 can extend through the connector 410, such as through the body 415. For example, the ground pads 455 can extend through multiple layers of a PCB structure. The ground pad can subsect portions of the body 415. For example, the ground pad 455 can isolate a plurality of the pins 425 from another subset of the pins 425. In this manner, a plurality of subsets of the pins 425 can be defined.

Figure 5:
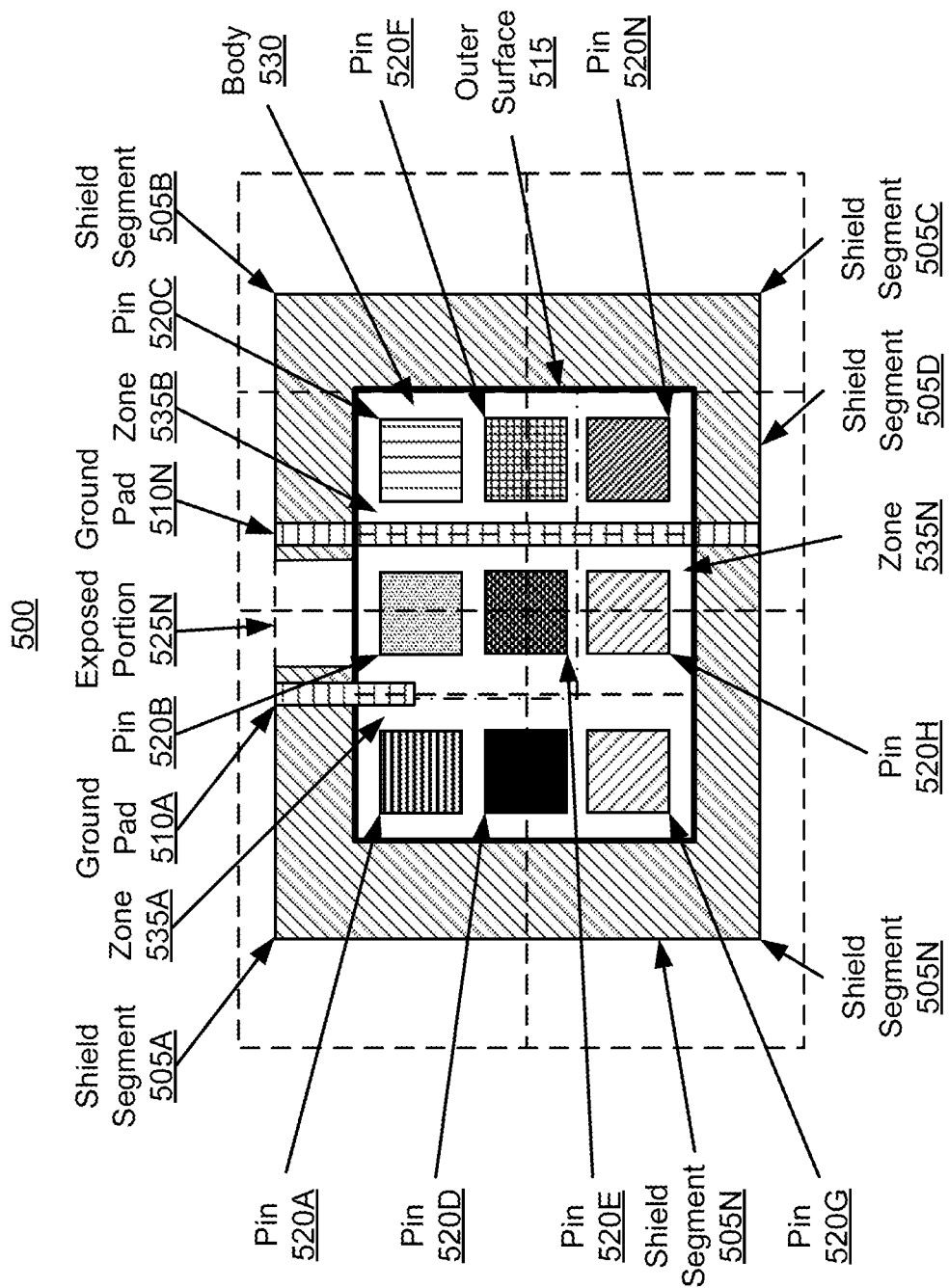
FIG. 5 is a front view of an example of a connector of a circuit board system, according to an example implementation.

FIG. 5 depicts an example of a connector 500, which can incorporate features of the connector 400 described with reference to FIG. 4. As described with reference to FIG. 4, the connector 500 can be used to connect various circuit boards 405 such as to connect PCBs and/or flexible printed circuits (FPCs) with one another. The connector 500 can be used to connect to one or more of a plurality of devices or circuits. The connector 500 can be configured to connect to one or more of a plurality of ports, such as USB-C, USB-B, or HDMI 1.0.

The connector 500 can include a body 530, for example one like body 415. The body 530 can be made of a plurality of materials, including rubber, dielectric, silicone, air or fiberglass for example. The body 530 can be shaped in a plurality of shapes, such as a rectangular prism, pyramid, or truncated cone. The body 530 can include a plurality of surfaces, such as at least one outer surface 515 (e.g., like outer surface 420 or portions thereof).

The connector 500 can include a plurality of pins 520 that extend through the body 530, such as from a first surface of the body 530 (e.g., front surface of the body 530 in the frame of reference of FIG. 5) to a second surface of the body 530 opposite the first surface. The pins 520 can be similar or identical to the pins 425. The pins 425 can be made of a conductive or grounding material, such as copper, zinc, steel, gold, silver, and can be at least solid, plated, a composite, or hollow. Some of the pins 520 can be used to perform communication, power or grounding functions (e.g., as a ground pin). The pins can receive and transmit (e.g., pass) signals. For example, the pins can pass signals ranging from 0 Hz (e.g., DC) up to high speeds (e.g., greater than 300 GHz). Signals passed can be like signals 440. Each pin can pass a different signal or a signal similar to another simultaneously. For example, pins 520A, 520D and 520G can pass a 30 GHz signal, pin 520B can pass a DC signal, pin 520F can pass a 10 kHz signal, pins 520E and 520H can pass no signal (e.g., may be grounded, operating as a ground pin), and pins 520C and 520N can pass a 20 MHz signal at the same time. The pins 520 can be subdivided into zones 535, as described below.

The connector 500 can include at least one shield (e.g., shield 435), which be formed as one or more segments 505. For example, the segments 505 can be made of copper, zinc, steel, iron, or a composite metal. The shield can be shaped, for example, as mesh, hollow tube, or sheet metal. The shield segments can be a plurality of different materials and shapes. For example, shield segment 505A can differ in material, shape, thickness, or other properties from shield segments 505B, 505C, and 505N. The shield 435 can cause an attenuation or reduction in noise from/between different signals passing thorough pins 520. The shield 435 can be positioned to cause a threshold attenuation of a signal having a frequency of at least 100 MHz passing through at least one pin 520 of the plurality of pins 425 (e.g., as detected from a location external to the connector). For example, a segment 505 of the shield 435 and/or ground connection/pin/pad(s) can be positioned to provide shielding between Pin 520B and 520C to prevent signal leakage between the pins.

The shield 435 and/or ground connection/pin/pad(s) can attenuate (lessen, decrease) high frequency noise (e.g., between pins 520 and/or signal conductors external to the connector) by being placed between, surrounding, or around pins with different signal characteristics. For example, a pin carrying a high frequency signal can be isolated from a pin carrying a low frequency signal by being at least partially encompassed by at least a segment 505 of shield 435 and/or ground connection/pin/pad(s).

As depicted in FIG. 5, the shield 435 can extend partially around the surface 512 to define portions (e.g., shield segments 505) of the surface 515 (and/or portions of the connector 500). The connector 500 can include the shield 435 including a first shield segment, and a second shield segment on an opposite side of the body 530 from the first shield segment 505A. The first shield segment can be any of the plurality of shield segments 505, and the second shield segment can be any shield segment 505 opposite and excluding the first shield segment. For example, the first shield segment can be shield segment 505A, and the second shield segment can be 505B, 505C, 505D or 505N. The shield 435 can include a third shield segment (of shield segments 505) connecting a first end of the first shield segment with a first end of the second shield segment. For example, a first shield segment 505B can be connected to the second shield segment 505D by shield segment 505C. The shield 435 can further include a trace (e.g., like ground pad 510N or traces 445) connecting a second end of the first shield segment with a second end of the second shield segment. For example, ground pad 510N can connect the ends of shield segment 505D and 505B. In some implementations, this can create a full shielding loop around the pins 520C, 520F, and 520N through the shield segments 505B, 505C, and 505D and the ground pad/connection 510N. These connections can vary in location and by segment and traces. The shielding loops can include more or fewer pins 520 than stated herein, and can exist in pluralities.

The shield 435 can be connected to ground pads 510N (e.g., ground connections). Ground pads 510N can be like ground pads 455. The shield segments 505 can form a partial or complete loop in conjunction with the ground pads 510N or any traces (e.g., traces 445) around any zone 535 of pins 520 to provide shielding. The connector 500 can include a ground pad (e.g., ground pad/connection 510N) extending at least partially through the body 530 to connect with one or more pins 520 (e.g., so that the one or more pins 520 operate as ground pins) to isolate a first subset of the plurality of pins on a first side of the ground pad from a second subset of the plurality of pins on a second side of the ground pad. For example, the ground pad/connection 510N can extend through the body 530 to isolate pins 520C, 520F and 520N from the rest of the plurality of pins 520. For example, ground pad/connection 510A can extend partially into the body 530 to connect with one or more pins 520 to ground the one or more pins 520 connected with the ground pad/connection 510A.

The shield 435 can include exposed portions or discontinuations, such as exposed portion 525N. Exposed portion 525N can include an unshielded (e.g., no shield segment 505 covering) section of the body. Exposed portion 525N can expose one or more pins 520. For example, pins 520B can be exposed via exposed portion 525N. This can, in an implementation, enable unshielded access to a pin 520. Exposed portion 525N can include a routing trace. The routing trace can be exposed and enable conduction of signals without being shielded. The routing trace can be like trace 445 and can be routed on the surface layer of connector 500.

Zones 535 can be any subdivision of the pins 520. Zones 535 can be figuratively represented by dashed lines within the FIG. 5. Zones 535 can include a physical barrier, such as a trace, pin, or grounding strip, or zones can be denoted for descriptive purposes with no physical barrier. Zones 535 can be used to divide pins by at least signal carried (e.g., signal frequency, amplitude, magnitude, phase, shape, or duration), by material, or by shape. For example, zones 535A can denote a high-frequency zone between the left shield segments and the zone 535A line. Connector 500 can include zones wherein the first pin (e.g., of pins 520) is in a zone (e.g., of zones 535) defined by respective edges of the first shield segment and the second shield segment (e.g., of shield segments 505), and the second pin is outside the zone and coupled with a routing trace on the second portion of the outer surface. For example, the first pin can be pin 520A and the second pin can be 520B. Pin 520B can be outside the zone defined by zone 535A (e.g., shield segment 505A and shield segment 505N) and can be coupled with a routing trace of the second portion (e.g., exposed portion 525N) of the outer surface 515.

The connector 500 can include a shield (e.g., shield 435) wherein the shield is a first shield (e.g., shield segment 505B). The connector 500 can further include a second shield (e.g., shield segment 505A) on a third portion of the outer surface 515 to define the second portion between the first portion and the third portion. The first shield, the second shield, and/or appropriately located ground connection/pin/pad(s) (if present), can cause a threshold attenuation of a signal passing through a first pin (e.g., pin 520C) of the plurality of pins adjacent to the first shield, at a second pin (e.g., pin 520B) of the plurality of pins adjacent to the second shield. For example, a plurality of zones 525 can be established by the creation of shields and isolation (e.g., via shield segments 505, exposed portion 525, and/or ground connection/pin/pad(s)). These zones 525 can be implemented as high speed zones and low speed zones (e.g., based on remote components connected with the connector 500 to communicate signals of particular speeds and/or frequencies). In some implementations, the low speed zones may be surrounded by the high speed zones. For example, pins 520A, 520C, 520D, 520F, 520G, and 520N may all pass high speed signals and may be considered to be in a high speed zone. These high-speed pins may be isolated from other pins 520 of the connector 500 by ground connection/pin/pad(s), exposed portion 525 and/or shield segments 505. For example, pins 520B, 520E and 520 H may be to pass low-speed signals and may be considered to be in a low-speed zone shielded from the high speed zone.

Figure 6:
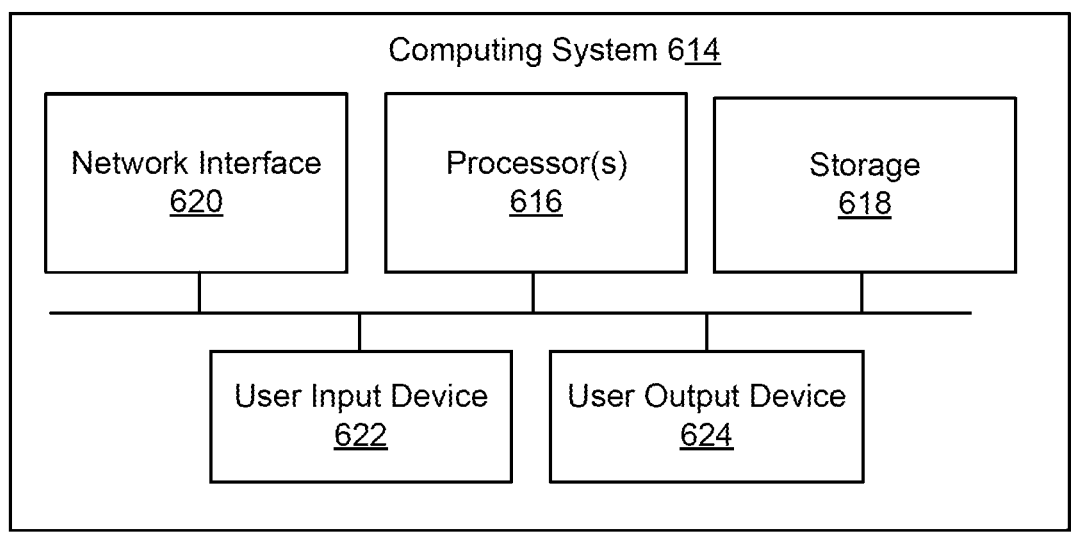
FIG. 6 is a block diagram showing a computing environment of a wearable device, according to an example implementation of the present disclosure.

Various operations described herein can be implemented on computer systems. FIG. 6 shows a block diagram of a representative computing system 614 usable to implement implementations of the present disclosure. In some implementations, the wearable device 110 of FIG. 1 is implemented by the computing system 614. The computing system 614 can be implemented, for example, as a consumer device such as a smartphone, other mobile phone, tablet computer, wearable computing device (e.g., a smart watch, eyeglasses, a head wearable display), desktop computer, laptop computer, or implemented with distributed computing devices. The computing system 614 can be implemented to provide VR, AR, MR experience. In some implementations, the computing system 614 can include conventional computer components such as processors 616, storage device 618, network interface 620, user input device 622, and user output device 624.

The network interface 620 can provide a connection to a wide area network (e.g., the Internet) to which WAN interface of a remote server system is also connected. The network interface 620 can include a wired interface (e.g., Ethernet) and/or a wireless interface implementing various RF data communication standards such as Wi-Fi, Bluetooth, or cellular data network standards (e.g., 3G, 4G, 5G, 60 GHz, LTE, etc.).

The user input device 622 can include any device (or devices) via which a user can provide signals to the computing system 614, which can interpret the signals as indicative of particular user requests or information. The user input device 622 can include any or all of a keyboard, touch pad, touch screen, mouse or other pointing device, scroll wheel, click wheel, dial, button, switch, keypad, microphone, sensors (e.g., a motion sensor, an eye tracking sensor, etc.), and so on.

The user output device 624 can include any device via which the computing system 614 can provide information to a user. For example, the user output device 624 can include a display (not depicted) to display images generated by or delivered to the computing system 614. The display can incorporate various image generation technologies, e.g., a liquid crystal display (LCD), light-emitting diode (LED) including organic light-emitting diodes (OLED), projection system, cathode ray tube (CRT), or the like, together with supporting electronics (e.g., digital-to-analog or analog-to-digital converters, signal processors, or the like). A device such as a touchscreen that functions as both input and output device can be used. The user output devices 624 can be provided in addition to or instead of a display. Examples include indicator lights, speakers, tactile "display" devices, printers, and so on.

Some implementations include electronic components, such as microprocessors, storage and memory that store computer program instructions in a computer readable storage medium (e.g., non-transitory computer readable medium). Many of the features described in this disclosure can be implemented as processes that are specified as a set of program instructions encoded on a computer readable storage medium. When these program instructions are executed by one or more processors, they cause the processors to perform various operation indicated in the program instructions. Examples of program instructions or computer code include machine code, such as is produced by a compiler, and files including higher-level code that are executed by a computer, an electronic component, or a microprocessor using an interpreter. Through suitable programming, the processors 616 can provide various functionality for the computing system 614, including any of the functionality described herein as being performed by a server or client, or other functionality associated with message management services.

It will be appreciated that the computing system 614 is illustrative and that variations and modifications are possible. Computer systems used in connection with the present disclosure can have other capabilities not specifically described here. Further, while the computing system 614 is described with reference to particular blocks, it is to be understood that these blocks are defined for convenience of description and are not intended to imply a particular physical arrangement of component parts. For instance, different blocks can be located in the same facility, in the same server rack, or on the same motherboard. Further, the blocks need not correspond to physically distinct components. Blocks can be configured to perform various operations, e.g., by programming a processor or providing appropriate control circuitry, and various blocks might or might not be reconfigurable depending on how the initial configuration is obtained. Implementations of the present disclosure can be realized in a variety of apparatus including electronic devices implemented using any combination of circuitry and software.

Having now described some illustrative implementations, it is apparent that the foregoing is illustrative and not limiting, having been presented by way of example. In particular, although many of the examples presented herein involve specific combinations of method acts or system elements, those acts and those elements can be combined in other ways to accomplish the same objectives. Acts, elements and features discussed in connection with one implementation are not intended to be excluded from a similar role in other implementations or implementations.

The hardware and data processing components used to implement the various processes, operations, illustrative logics, logical blocks, modules and circuits described in connection with the implementations disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function. The memory (e.g., memory, memory unit, storage device, etc.) may include one or more devices (e.g., RAM, ROM, Flash memory, hard disk storage, etc.) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary implementation, the memory is communicably connected to the processor via a processing circuit and includes computer code for executing (e.g., by the processing circuit and/or the processor) the one or more processes described herein.

The present disclosure contemplates methods, systems and program products on any machine-readable media for accomplishing various operations. The implementations of the present disclosure may be implemented using existing computer processors, or by a special purpose computer processor for an appropriate system, incorporated for this or another purpose, or by a hardwired system. Implementations within the scope of the present disclosure include program products comprising machine-readable media for carrying or having machine-executable instructions or data structures stored thereon. Such machine-readable media can be any available media that can be accessed by a general purpose or special purpose computer or other machine with a processor.

By way of example, such machine-readable media can comprise RAM, ROM, EPROM, EEPROM, or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular can also embrace implementations including a plurality of these elements, and any references in plural to any implementation or element or act herein can also embrace implementations including only a single element. References in the singular or plural form are not intended to limit the presently disclosed systems or methods, their components, acts, or elements to single or plural configurations. References to any act or element being based on any information, act or element can include implementations where the act or element is based at least in part on any information, act, or element.

Any implementation disclosed herein can be combined with any other implementation or implementation, and references to "an implementation," "some implementations," "one implementation" or the like are not necessarily mutually exclusive and are intended to indicate that a particular feature, structure, or characteristic described in connection with the implementation can be included in at least one implementation or implementation. Such terms as used herein are not necessarily all referring to the same implementation. Any implementation can be combined with any other implementation, inclusively or exclusively, in any manner consistent with the aspects and implementations disclosed herein.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Systems and methods described herein may be embodied in other specific forms without departing from the characteristics thereof. References to "approximately," "about" "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

The term "coupled" and variations thereof includes the joining of two members directly or indirectly to one another. Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

References to "or" can be construed as inclusive so that any terms described using "or" can indicate any of a single, more than one, and all of the described terms. A reference to "at least one of 'A' and 'B'" can include only 'A', only 'B', as well as both 'A' and 'B'. Such references used in conjunction with "comprising" or other open terminology can include additional items.

Modifications of described elements and acts such as variations in sizes, dimensions, structures, shapes and proportions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

References herein to the positions of elements (e.g., "top," "bottom," "above," "below") are merely used to describe the orientation of various elements in the figures. The orientation of various elements may differ according to other exemplary implementations, and that such variations are intended to be encompassed by the present disclosure.

What is claimed is:

1. A device, comprising:
   a body having an outer surface;
   a plurality of pins in the body, a first pin of the plurality of pins configured to receive a first signal having a first rate, a second pin of the plurality of pins configured to receive a second signal having a second rate less than the first rate; and
   a shield on a first portion of the outer surface to define an exposed second portion of the outer surface, wherein the second pin is positioned closer to the exposed second portion than the first pin.

2. The device of claim 1, wherein the shield comprises a first shield segment, and a second shield segment on an opposite side of the body from the first shield segment.

3. The device of claim 2, wherein:
the shield comprises a third shield segment connecting a first end of the first shield segment with a first end of the second shield segment; and
the device further comprises a trace connecting a second end of the first shield segment with a second end of the second shield segment.

4. The device of claim 2, wherein the first pin is in a zone defined by respective edges of the first shield segment and the second shield segment, and the second pin is outside the zone and coupled with a routing trace on the exposed second portion of the outer surface.

5. The device of claim 1, further comprising a ground pad to isolate the first pin located on a first side of the ground pad from the second pin located on a second side of the ground pad.

6. The device of claim 1, wherein the first signal has a noise component having a frequency of at least 100 MHz, and the shield is positioned relative to the first pin to reduce the noise component by at least a threshold amount.

7. The device of claim 1, wherein:
the shield is a first shield;
the device further comprising a second shield on a third portion of the outer surface to define the exposed second portion between the first portion and the third portion, the first shield and the second shield to cause a threshold attenuation of noise arising from a signal passing through the first pin.

8. A circuit of a wearable device, comprising:
a circuit board; and
a connector, comprising:
a body having an outer surface;
a plurality of pins in the body, a first pin of the plurality of pins configured to receive a first signal having a first frequency, a second pin of the plurality of pins configured to receive a second signal having a second frequency less than the first frequency; and
a shield on a first portion of the outer surface to define an exposed second portion of the outer surface, wherein the second pin is positioned closer to the exposed second portion than the first pin.

9. The circuit of claim 8, wherein the shield comprises a first shield segment and a second shield segment on an opposite side of the body from the first shield segment.

10. The circuit of claim 8, wherein:
the shield comprises a third shield segment connecting a first end of the first shield segment with a first end of the second shield segment; and
the connector further comprises a trace connecting a second end of the first shield segment with a second end of the second shield segment.

11. The circuit of claim 8, wherein the first pin is in a zone defined by respective edges of the first shield segment and the second shield segment, and the second pin is outside the zone and coupled with a routing trace on the exposed second portion of the outer surface.

12. The circuit of claim 8, further comprising a ground pad to isolate the first pin located on a first side of the ground pad from the second pin located on a second side of the ground pad.

13. The circuit of claim 8, wherein the shield is positioned relative to the first pin to cause a threshold attenuation of noise arising from a signal having a frequency of at least 100 MHz passing through the first pin.

14. The circuit of claim 8, wherein:
the shield is a first shield;
the device further comprising a second shield on a third portion of the outer surface to define the exposed second portion between the first portion and the third portion, the first shield and the second shield to cause a threshold attenuation of noise arising from a signal passing through the first pin.

15. A wearable device, comprising:
a data transmission circuit;
a circuit board; and
a connector connecting the communication circuit with the circuit board, the connector comprising:
a body having an outer surface;
a plurality of pins in the body, one or more pins of the plurality of pins coupled with the circuit board, a first pin of the plurality of pins configured to receive a first signal having a first frequency, a second pin of the plurality of pins configured to receive a second signal having a second frequency less than the first frequency; and
a shield on a first portion of the outer surface to define an exposed second portion of the outer surface, wherein the second pin is positioned closer to the exposed second portion than the first pin.

16. The circuit of claim 15, wherein the shield comprises a first shield segment and a second shield segment on an opposite side of the body from the first shield segment.

17. The circuit of claim 16, wherein:
the shield comprises a third shield segment connecting a first end of the first shield segment with a first end of the second shield segment; and
the first pin is in a zone defined by the first shield segment, the second shield segment and the third shield segment, the second pin is outside the zone and coupled with a routing trace on the exposed second portion of the outer surface.

18. The wearable device of claim 15, further comprising a ground pad to isolate the first pin located on a first side of the ground pad from the second pin located on a second side of the ground pad.

19. The wearable device of claim 15, wherein the shield is positioned to cause a threshold attenuation of noise arising from a signal having a frequency of at least 100 MHz passing through the first pin.

20. The wearable device of claim 15, wherein:
the shield is a first shield;
the device further comprising a second shield on a third portion of the outer surface to define the exposed second portion between the first portion and the third portion, the first shield and the second shield to cause a threshold attenuation of noise arising from a signal passing through the first pin.

* * * * *